(12) United States Patent
Choi et al.

(10) Patent No.: US 7,549,033 B2
(45) Date of Patent: *Jun. 16, 2009

(54) DUAL EDGE COMMAND

(75) Inventors: Joo S. Choi, Boise, ID (US); Troy A. Manning, Meridian, ID (US); Brent Keeth, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 129 days.

This patent is subject to a terminal disclaimer.

(21) Appl. No.: 11/495,418

(22) Filed: Jul. 28, 2006

(65) Prior Publication Data

US 2006/0265565 A1 Nov. 23, 2006

Related U.S. Application Data

(63) Continuation of application No. 10/767,555, filed on Jan. 29, 2004, now Pat. No. 7,299,329.

(51) Int. Cl.
*G06F 12/00* (2006.01)
*G06F 13/00* (2006.01)

(52) U.S. Cl. .............. 711/167; 711/211; 711/154; 365/189.02; 365/189.03; 365/230.02

(58) Field of Classification Search .......... 711/154, 711/167; 365/189.02, 189.03, 230.02, 230.05
See application file for complete search history.

(56) References Cited

U.S. PATENT DOCUMENTS

| | | | |
|---|---|---|---|
| 3,902,163 A | 8/1975 | Amdahl et al. | |
| 3,922,644 A | 11/1975 | Borbas et al. | |
| 4,061,933 A | 12/1977 | Schroeder et al. | |
| 4,360,903 A | 11/1982 | Plachno et al. | |
| 4,373,179 A | 2/1983 | Katsumata | |
| 4,535,427 A | 8/1985 | Jiang | |
| 4,595,845 A | 6/1986 | Briggs | |
| 4,649,301 A | 3/1987 | Van Tran | |
| 4,774,653 A | 9/1988 | James | |
| 4,873,521 A | 10/1989 | Dietrich et al. | |
| 5,223,755 A | 6/1993 | Richley | |
| 5,604,775 A | 2/1997 | Saitoh et al. | |
| 5,666,321 A | 9/1997 | Schaefer | |
| 5,811,998 A | 9/1998 | Lundberg et al. | |
| 5,845,108 A * | 12/1998 | Yoo et al. | 713/400 |

(Continued)

OTHER PUBLICATIONS

"400 Mb/s/pin SLDRAM, 4M x 18 SLDRAM, Pipelined, Eight Bank, 2.5V Operation", *SLDRAM Inc.*, (1998), 1-69.

(Continued)

*Primary Examiner*—Pierre-Michel Bataille
*Assistant Examiner*—Michael C Krofcheck
(74) *Attorney, Agent, or Firm*—Schwegman, Lundberg & Woessner, P.A.

(57) ABSTRACT

A technique to increase transfer rate of command and address signals via a given number of command and address pins in each of one or more integrated circuit memory devices during a clock cycle of a clock signal. In one example embodiment, the command and address signals are sent on both rising and falling edges of a clock cycle of a clock signal to increase the transfer rate and essentially reduce the number of required command and address pins in each integrated circuit memory device.

42 Claims, 9 Drawing Sheets

U.S. PATENT DOCUMENTS

| | | | |
|---|---|---|---|
| 5,878,235 | A | 3/1999 | Porterfield et al. |
| 5,946,260 | A | 8/1999 | Manning |
| 5,969,552 | A | 10/1999 | Lee et al. |
| 5,973,989 | A | 10/1999 | Pawlowski |
| 6,005,823 | A | 12/1999 | Martin et al. |
| 6,008,074 | A | 12/1999 | Brand |
| 6,029,250 | A | 2/2000 | Keeth |
| 6,029,252 | A | 2/2000 | Manning |
| 6,094,704 | A | 7/2000 | Martin et al. |
| 6,094,727 | A | 7/2000 | Manning |
| 6,101,197 | A | 8/2000 | Keeth et al. |
| 6,111,812 | A | 8/2000 | Gans et al. |
| 6,125,078 | A | 9/2000 | Ooishi et al. |
| 6,141,263 | A | 10/2000 | Protzman |
| 6,142,830 | A | 11/2000 | Loeffler |
| 6,167,495 | A | 12/2000 | Keeth et al. |
| 6,172,893 | B1 | 1/2001 | Ryan |
| 6,175,894 | B1 | 1/2001 | Manning |
| 6,178,133 | B1 | 1/2001 | Manning |
| 6,178,488 | B1 | 1/2001 | Manning |
| 6,181,616 | B1 | 1/2001 | Byrd |
| 6,192,002 | B1 | 2/2001 | Merritt |
| 6,195,724 | B1 | 2/2001 | Stracovskt et al. |
| 6,209,052 | B1 | 3/2001 | Chin et al. |
| 6,243,282 | B1 | 6/2001 | Rondeau et al. |
| 6,243,797 | B1 * | 6/2001 | Merritt ...................... 711/167 |
| 6,256,217 | B1 | 7/2001 | Rondeau et al. |
| 6,266,734 | B1 | 7/2001 | LaBerge |
| 6,266,750 | B1 | 7/2001 | DeMone et al. |
| 6,279,090 | B1 | 8/2001 | Manning |
| 6,286,062 | B1 | 9/2001 | Ryan |
| 6,301,322 | B1 | 10/2001 | Manning |
| 6,310,816 | B2 | 10/2001 | Manning |
| 6,321,315 | B1 | 11/2001 | LaBerge |
| 6,338,127 | B1 | 1/2002 | Manning |
| 6,355,985 | B1 | 3/2002 | Brand |
| 6,360,292 | B1 | 3/2002 | Manning |
| 6,374,360 | B1 | 4/2002 | Keeth et al. |
| 6,377,093 | B1 | 4/2002 | Lee et al. |
| 6,378,049 | B1 | 4/2002 | Stracovsky et al. |
| 6,388,480 | B1 | 5/2002 | Stubbs |
| 6,392,951 | B2 * | 5/2002 | Fujima et al. .......... 365/230.03 |
| 6,405,280 | B1 | 6/2002 | Ryan |
| 6,405,296 | B1 | 6/2002 | Barth et al. |
| 6,412,052 | B2 | 6/2002 | Keeth et al. |
| 6,414,903 | B1 | 7/2002 | Keeth et al. |
| 6,425,045 | B2 | 7/2002 | LaBerge |
| 6,434,684 | B1 | 8/2002 | Manning |
| 6,442,644 | B1 | 8/2002 | Gustavson et al. |
| 6,445,624 | B1 | 9/2002 | Janzen et al. |
| 6,477,631 | B1 | 11/2002 | Martin et al. |
| 6,484,244 | B1 | 11/2002 | Manning |
| 6,496,440 | B2 | 12/2002 | Manning |
| 6,510,474 | B1 | 1/2003 | Stracovsky et al. |
| 6,519,675 | B1 | 2/2003 | Manning |
| 6,519,689 | B2 | 2/2003 | Manning |
| 6,560,669 | B1 | 5/2003 | Ryan |
| 6,587,804 | B1 | 7/2003 | Johnson et al. |
| 6,621,316 | B1 | 9/2003 | Kirsch |
| 6,625,242 | B1 | 9/2003 | Yoo et al. |
| 6,636,935 | B1 | 10/2003 | Ware et al. |
| 6,647,523 | B2 | 11/2003 | Manning |
| 6,697,297 | B2 | 2/2004 | Keeth et al. |
| 6,704,881 | B1 | 3/2004 | Li et al. |
| 6,706,565 | B2 | 3/2004 | Brand |
| 6,724,666 | B2 | 4/2004 | Janzen et al. |
| 6,789,155 | B2 | 9/2004 | Jeddeloh |
| 6,801,989 | B2 | 10/2004 | Johbnson et al. |
| 6,851,032 | B2 | 2/2005 | LaBerge et al. |
| 6,934,813 | B1 | 8/2005 | Jeddeloh |
| 6,950,893 | B2 | 9/2005 | Chan |
| 6,968,026 | B1 | 11/2005 | Li et al. |
| 7,055,012 | B2 | 5/2006 | LaBerge et al. |
| 7,085,975 | B2 | 8/2006 | Manning |
| 7,299,329 | B2 | 11/2007 | Choi et al. |
| 2001/0006483 | A1 | 7/2001 | Ohshima et al. |
| 2003/0123319 | A1 * | 7/2003 | Kim .......................... 365/233 |
| 2005/0172095 | A1 | 8/2005 | Choi et al. |

OTHER PUBLICATIONS

"Draft Standard for A High-Speed Memory Interface (SyncLink)", *The Institute of Electrical and Electronics Engineers, Inc.* Draft 0.99 IEEE P1596.7-T99X, (1996), 1-55.

"New NEC Memory Technology Increases Performance by 20%", http://www.nb-pacifica.com/headline/newnecmemorytechnolo__1144.sh,(1997), 1-2.

"SL-DRAM Protocol and Command Format", Slide Presentation, MOSAID Technologies, Inc., Joint Electron Device Engineering Council, Maui,(Dec. 11, 1996),22 slides.

"Virtual Channel Memory", *NEC Electronics Inc.*, (1997), 1-2.

Gillingham, P , "SLDRAM Architectural and Functional Overview", *The SLDRAM Consortium*, (Aug. 1997), 1-14.

* cited by examiner

DUAL EDGE COMMAND

RELATED APPLICATIONS

This application is a Continuation of U.S. application Ser. No. 10/767,555, filed Jan. 29, 2004 now U.S. Pat. No. 7,299,329, which is incorporated herein by reference.

FIELD OF THE INVENTION

The present invention relates to memory circuits and, in particular, to circuitry associated with command and address pins of a DRAM (dynamic random access memory).

BACKGROUND OF THE INVENTION

In order to perform data transfers, such as a store and an access, to and from conventional DRAM devices, the command and address signals are generally initiated on a rising edge (the transition from logic level "zero" to "one") or alternatively a falling edge of a clock signal. In a high speed DRAM design, using the current scheme to store and access the data from a DRAM can result in requiring a significantly higher number of command and address pins. Further, any increase in the number of command and address pins, can also result in a significant overhead for the DRAM controller performing data transfers via multiple DRAMs. For example, a DRAM controller coupled to access 8×32DRAMs in a system, parallelly or concurrently, can require nearly 256 bit input/output (I/O) interfaces. Furthermore, for efficient handling of the command and address signals, the DRAM controller may also have to assign a similar number of command and address pins. Therefore, any increase in the number of command and address pins in a DRAM, in the above system, can also result in requiring similar increase in the command and address pins in each DRAM for the DRAM controller. This is because of operating the command and address signals at half cycles and because of using the command and address pins for a single purpose or a single cycle in conventional double data rate (DDR) DRAM devices.

In addition, during the last several decades, memory technology has progressed dramatically. The density of commercial memory devices, such as the DRAM, has increased from 1 Kbit to 256 Mbits per chip, a factor of 256,000. Unfortunately, as the density goes up the number of command and address pins required to store and access data has also increased considerably. Increasing the number of command and address pins can result in a bigger package size for reasons described-above. As the packaging density increases, accommodating more number of command and address pins in a smaller package becomes more difficult.

Accordingly, there is a need in the art for a technique to reduce the number of command and address pins required in DRAMs to perform data transfers to and from the DRAMs.

DETAILED DESCRIPTION OF THE INVENTION

In the following detailed description, reference is made to various specific embodiments in which the invention may be practiced. These embodiments are described with sufficient detail to enable those skilled in the art to practice the invention, and it is to be understood that other embodiments may be employed, and that structural, logical, electrical, and process changes may be made without departing from the teachings of the invention.

In the foregoing description of the preferred embodiments, various features of the invention are grouped together in a single embodiment for the purpose of streamlining the disclosure. This method of disclosure is not to be interpreted as reflecting an intention that the claimed invention requires more features than are expressly recited in each claim. Rather, as the following claims reflect, inventive aspects lie in less than all features of a single disclosed embodiment. Thus, the following claims are hereby incorporated into the description of the preferred embodiments, with each claim standing on its own as a separate preferred embodiment of the invention.

The present invention provides techniques to reduce number of command and address pins required in a DRAM to reduce the package size and to essentially increase the number of command and address signals sent for a given set of command and address pins in the DRAM. The terms "sending" and "initiating" are used interchangeably throughout the document. References to "rising edge" and "falling edge" of a clock or control signal is for illustrative purposes only since those skilled in the art readily know that true or complementary clock and control signals may be used in which a rising edge may be substituted for a falling edge. Therefore, a clock or control signal may substitute any clock transition (rising or falling) and still fall within the scope of this description and claims.

Figure 1:
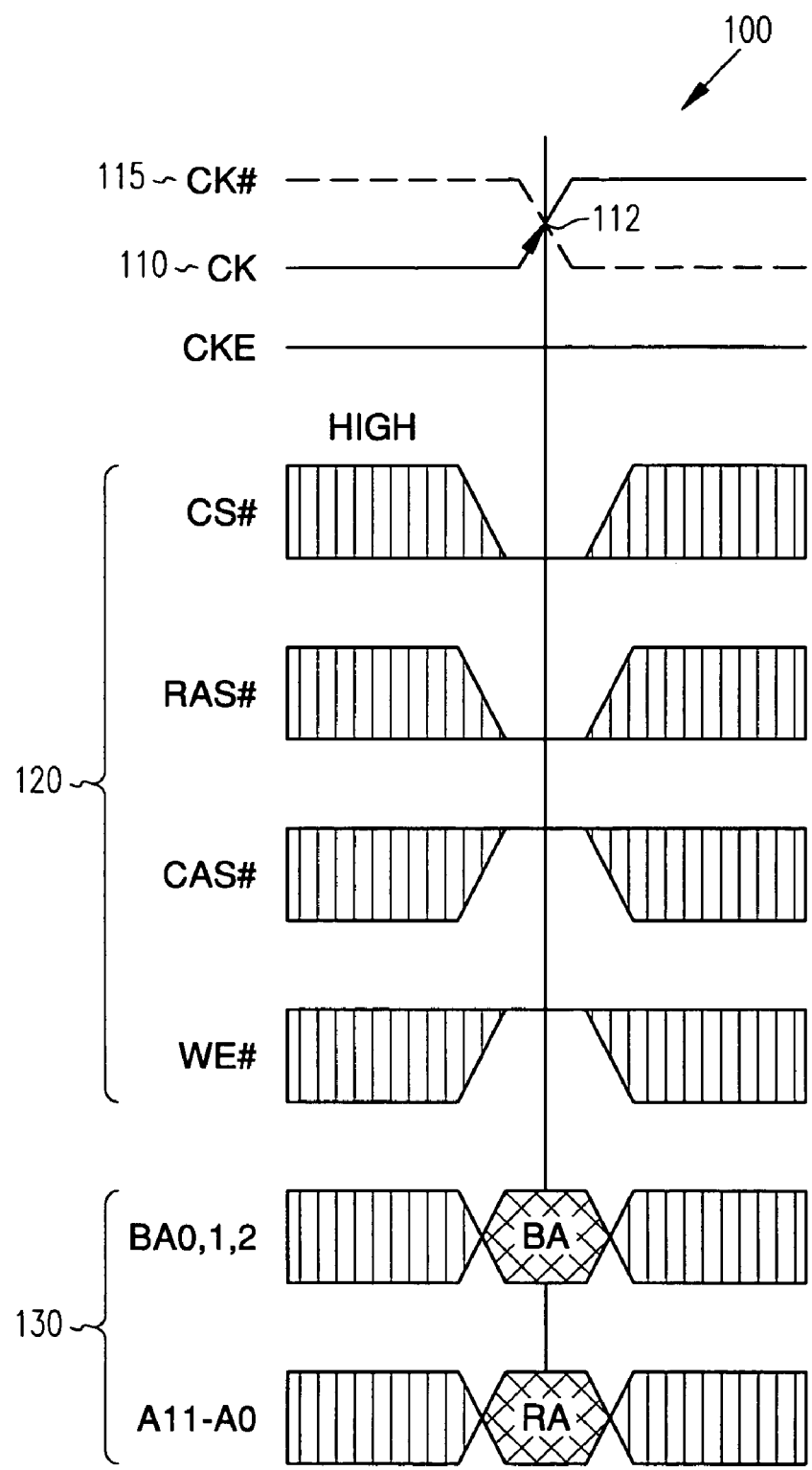
FIG. 1 is a timing diagram illustrating one approach of initiating the command and address signals to transfer data to and from the DRAM upon the rising edge of a clock signal in a conventional DRAM.

Referring now to FIG. 1, there is illustrated one conventional technique employed in initiating command and address signals by a DRAM controller to access data from a DRAM upon the rise (active edge) of a timing signal. As shown in the timing diagram 100 of FIG. 1, the DRAM controller sends the command signals 120, such as Chip Select (CS#), Row Address Strobe (RAS#), Column Address Strobe (CAS#), and Write Enable (WE#) and the address signals 130, such as BA0~2 and A11~A0 during a rising edge 112 of a clock (CK) signal 110. Also shown in FIG. 1 is clock signal (CK#) 115 which is an inverse of the CK signal 110. It can be envisioned that the command and address signals can also be initiated, similarly as described-above, during a falling edge of the CK# signal 115. As described-above, the problem with this technique is as the density of the DRAMs goes up the number of command and address pins required to store and access data can also increase proportionately in each DRAM. Increasing the number of command and address pins can result in a significantly bigger package size. As the packaging density increases, accommodating more number of command and address pins in a smaller package becomes difficult.

Figure 2:
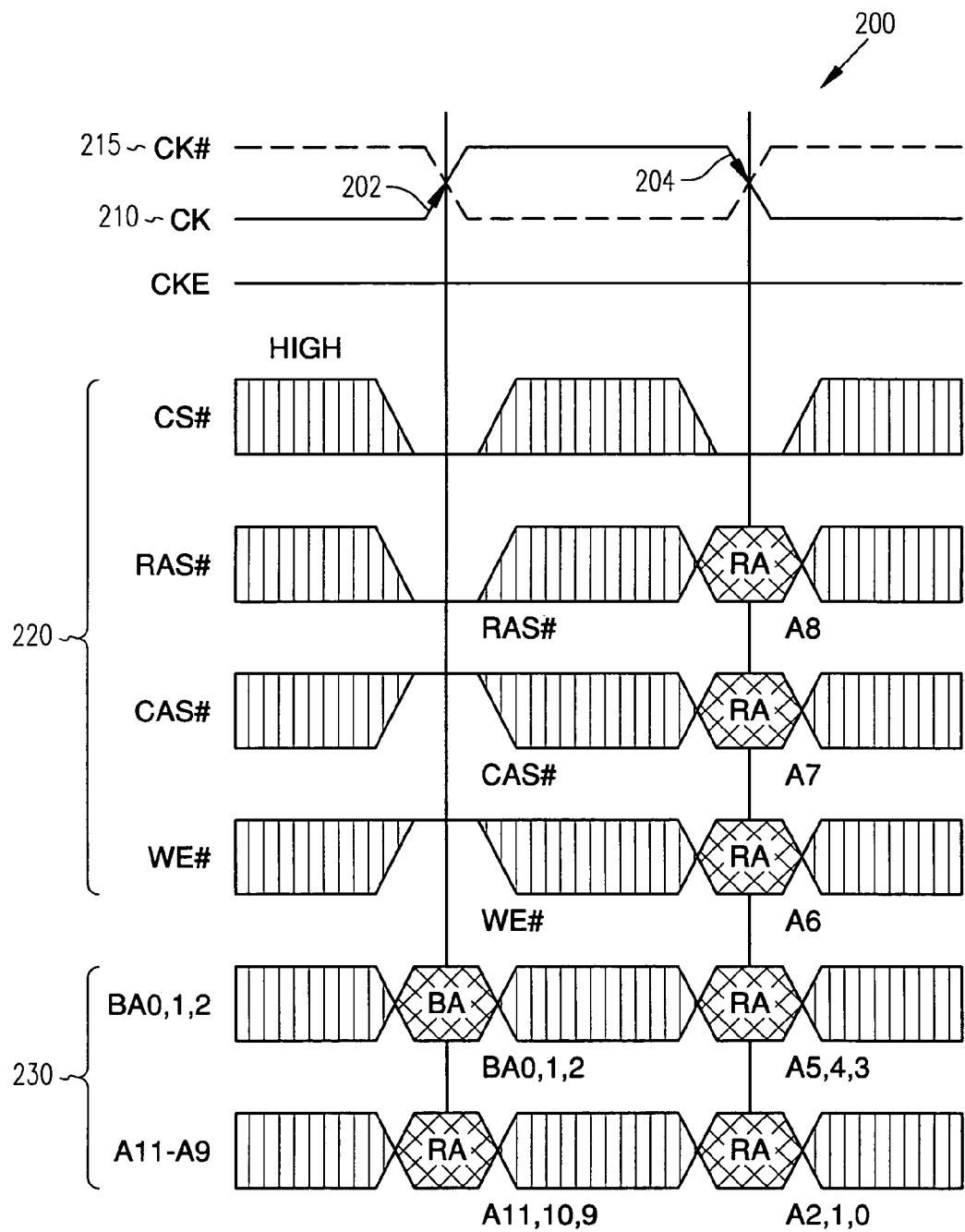
FIG. 2 is an exemplary embodiment of a timing diagram illustrating the initiating of the command and address signals to transfer data to and from a DRAM upon the rising and falling edges of a clock signal according to the present invention.

Referring now to FIG. 2, there is illustrated an example timing diagram 200 of initiating command and address signals by a controller to an integrated circuit memory device according to the present invention. As shown in FIG. 2, the command signals 220, such as CS#, RAS#, CAS#, and WE# and address signals 230, such as BA0~2 and A0~1 1 are initiated by the controller during both rising and falling edges 202 and 204 of a timing cycle of a timing signal 210 to increase the transfer rate of the command and address signals during the timing cycle. In some embodiments, the timing cycle of the timing signal is a clock cycle in a clock signal (CK). In these embodiments, the rising and falling edges 202 and 204 comprise transition from a logic level "zero" to a logic level "one" and transition from the logic level "one" to the logic level "zero", respectively.

Also in these embodiments, the controller can be a device, such as a central processing unit (CPU), a graphics processing unit (GPU), a processor, and/or a dynamic random access memory (DRAM) controller. In these embodiments, the integrated circuit memory device is a DRAM device. It can be seen from FIG. 2 that by sending the command and address signal upon both the rising and falling edges of a clock cycle the number of command and address signals sent during a clock cycle can be significantly more than the conventional technique described-above with reference to FIG. 1. It can be envisioned that by increasing the sending of the number of command and address signals in a clock cycle, the number of required command and address pins can be considerably reduced to achieve a higher packaging density in a DRAM.

The clock signal (CK#) 215 is an inverse of the clock signal (CK) 210 shown in FIG. 2. Again, it can be envisioned that by initiating the command and address signals during the rising and falling edges of CK# 215, similar to initiating the command and address signals during the rising and falling edges of CK 210 as described-above, the transfer rate of the command and address signals 220 and 230 sent during the clock cycle can be increased.

Figure 3:
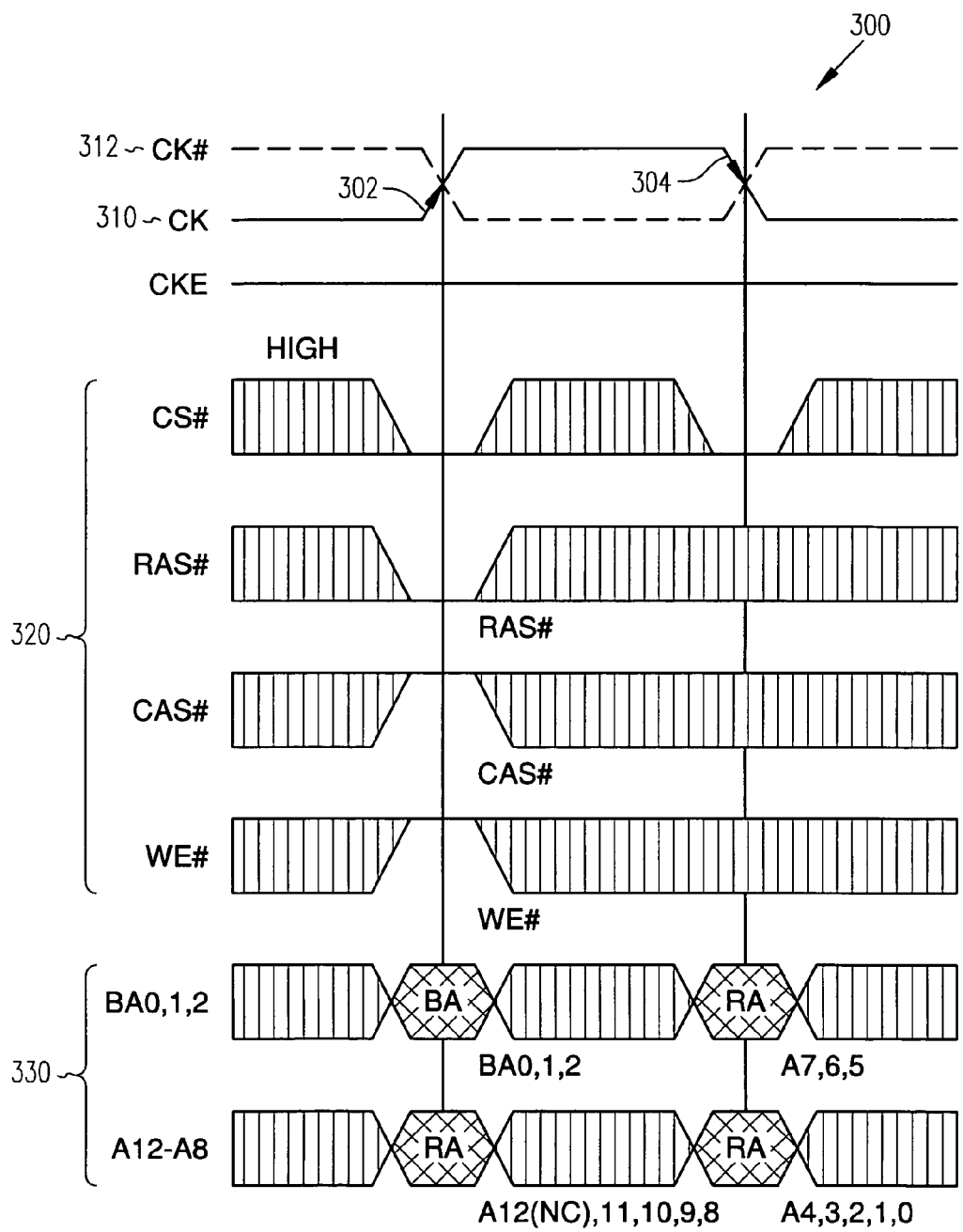
FIG. 3 is another exemplary embodiment of a timing diagram illustrating the initiating of the command and address signals to transfer data to and from a DRAM upon the rising and falling edges of a clock signal according to the present invention.

Referring now to FIG. 3, there is illustrated another example timing diagram 300 of initiating command and address signals by a controller to an integrated circuit memory device according to the present invention. As shown in FIG. 3, the command signals 320, such as CS#, RAS#, CAS#, and WE# and address signals 330, such as BA0~2 and A12~8 are initiated by the controller during a rising edge 302 of a clock cycle of a CK 310. In addition, the address signals, such as A0~7 are initiated during a falling edge 304 of the clock cycle of the CK 310 to increase the transfer rate of the command and address signals during the clock cycle for a given number of command and address pins in a DRAM device. Again it can be envisioned that using an inverse clock signal (CK#) 312 shown in FIG. 3 and initiating command and address signals as described-above can also increase the transfer rate of the command and address signals 320 and 330 sent by the controller during the clock cycle.

Figure 4:
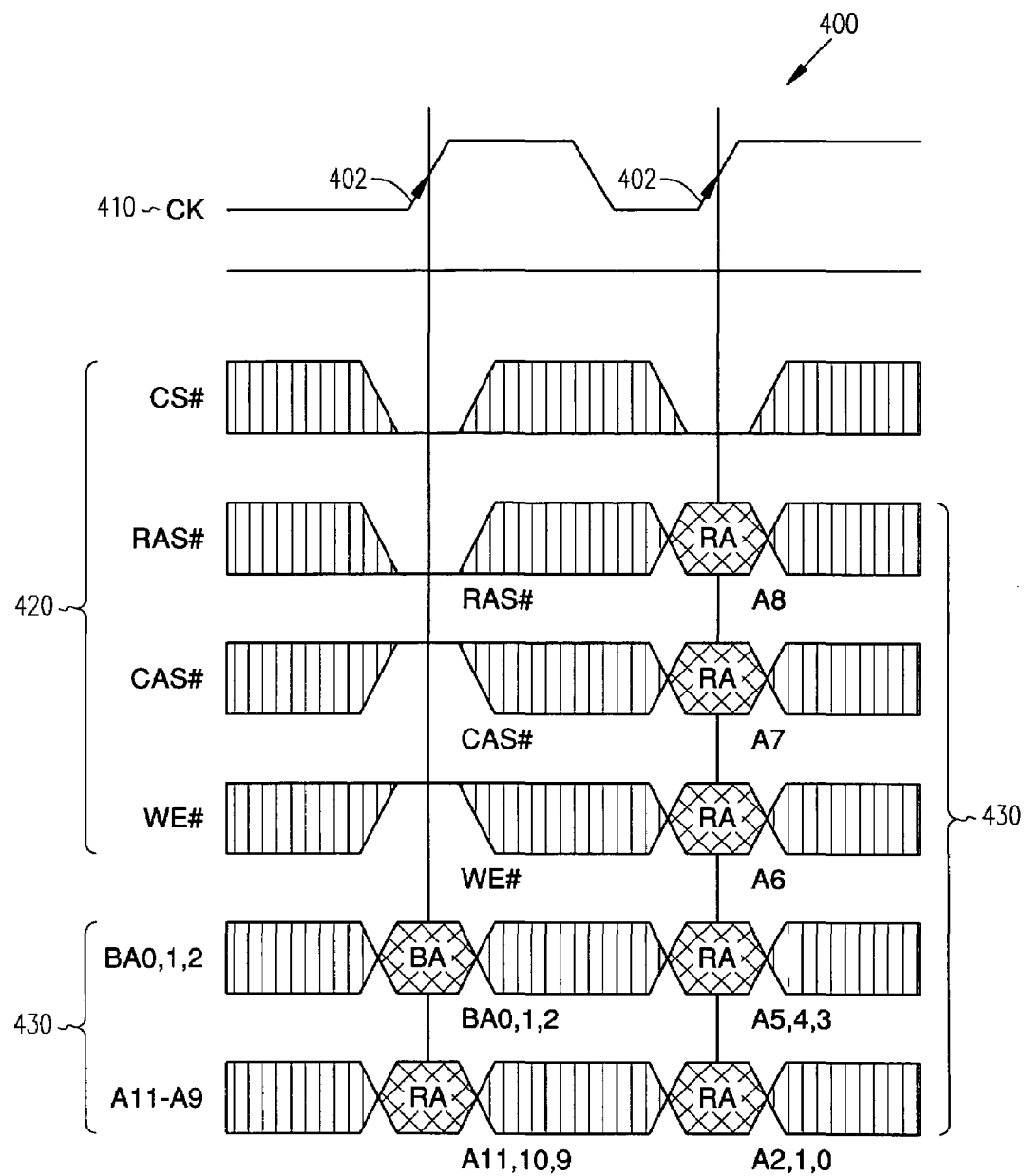
FIG. 4 is another exemplary embodiment of a timing diagram illustrating the initiating of the command and address signals to transfer data to and from a DRAM upon two substantially consecutive rising edges of a clock signal according to the present invention.

Referring now to FIG. 4, there is illustrated an example timing diagram 400 of initiating command and address signals by a controller to an integrated circuit memory device according to the present invention. As shown in FIG. 4, the command signals 420, such as CS#, RAS#, CAS#, and WE# and address signals 430, such as BA0~2 and A0~11 are initiated by the controller during two substantially consecutive rising edges 402 of a CK 410 to increase the transfer rate of the command and address signals during the two substantially consecutive cycles. The transfer rate of the command and address signals achieved by using this method 400 is lower than the transfer rate achieved with the method 200 described-above with reference to FIG. 2. Because, the method 400 essentially requires one additional clock cycle to complete sending all of the command and address signals 420 and 430. But, in the GHz clock frequency era, adding one additional clock cycle to send the command and address signals 420 and 430 does not significantly lower the transfer rates.

Figure 5:
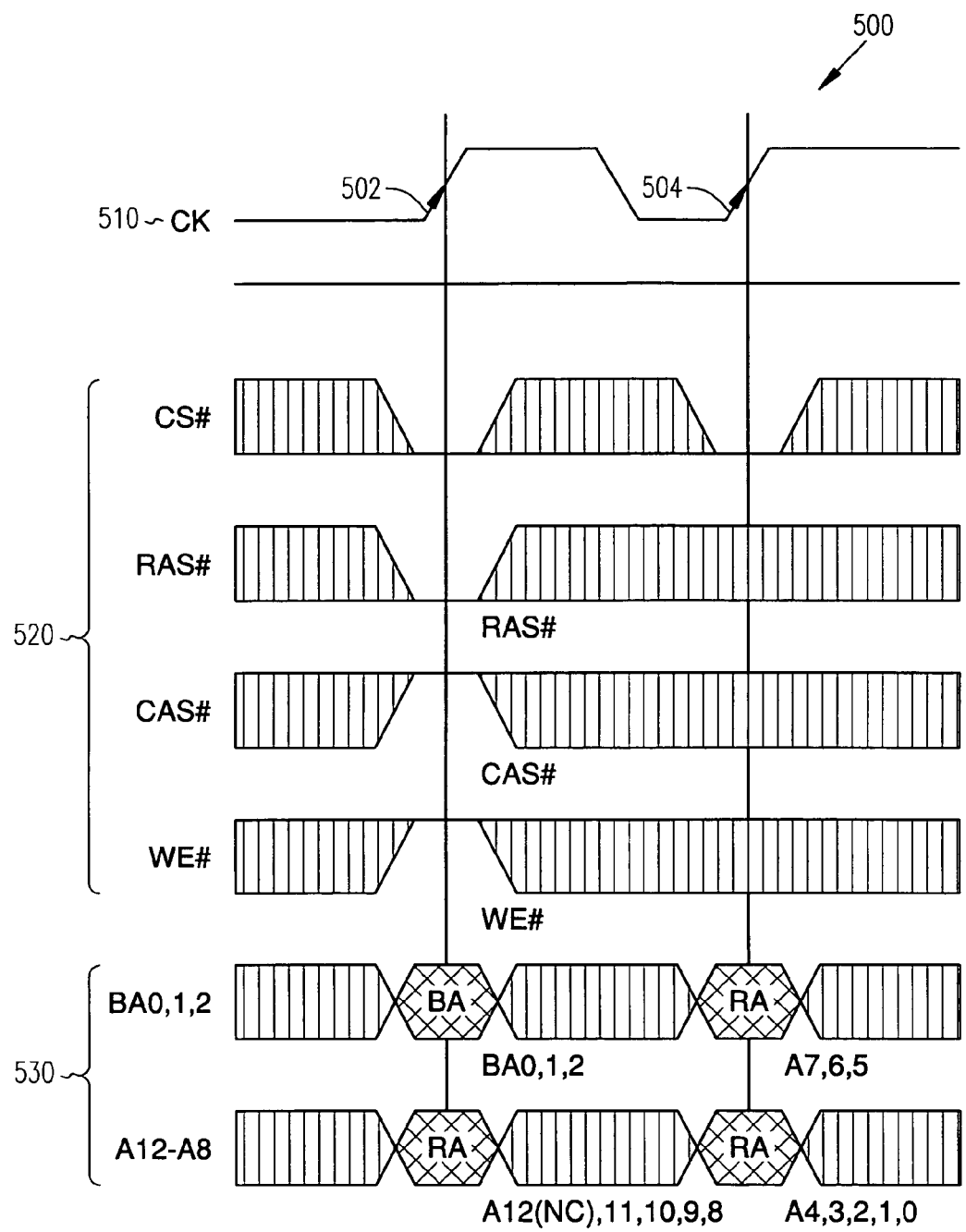
FIG. 5 is another exemplary embodiment of a timing diagram illustrating the initiating of the command and address signals to transfer data to and from a DRAM upon the two substantially consecutive rising edges of a clock signal according to the present invention.

Referring now to FIG. 5, there is illustrated another example timing diagram 500 of initiating command and address signals by a controller to an integrated circuit memory device according to the present invention. As shown in FIG. 5, the command signals 520, such as CS#, RAS#, CAS#, and WE# and address signals 530, such as BA0~2 and A11~9 are initiated by the controller during a rising edge 502 of a clock cycle of a CK 510. In addition, the address signals, such as A0~8 are initiated during a rising edge 504 of a substantially subsequent clock cycle of the CK 510 to increase the transfer rate of the command and address signals during two substantially subsequent clock cycles for a given number of command and address pins in an integrated circuit memory device. Again, it can be envisioned that an inverse of the CK 510 can also be used, as described-above, to increase the transfer rate of the command and address signals sent during the clock cycle. Again, it can also be seen that in the GHz range, adding one additional clock cycle to send the address signals 530 does not significantly lower the transfer rates of the command and address signals between the controller and one or more integrated circuit memory devices. The hatched state shown in FIGS. 1-5 for the command and address signals indicate that the signals must be held in one state so they may be read. The signal portion marked with vertical lines indicate that the signals may be in any state since they are not being read during that time period.

Figure 6:
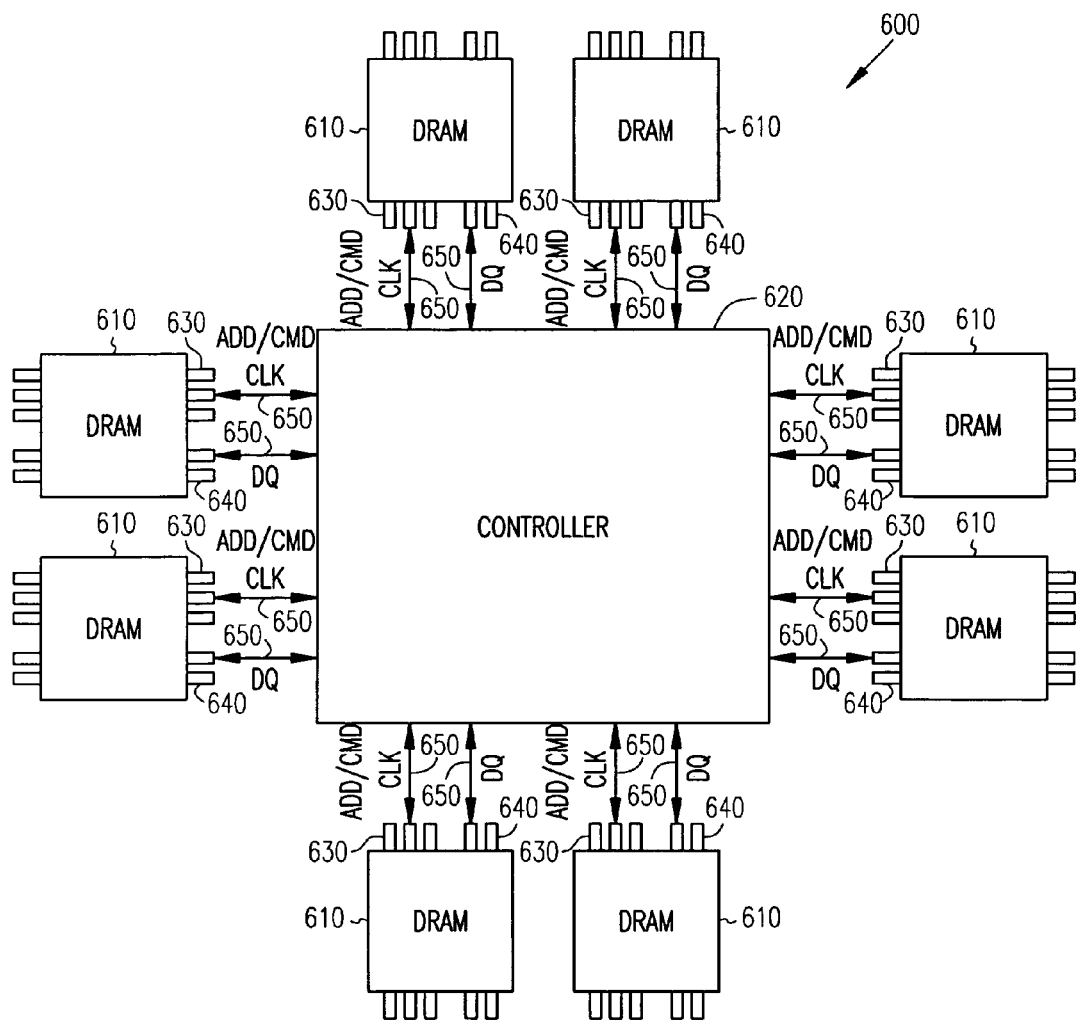
FIG. 6 is a block diagram illustrating the interconnections between a controller and multiple DRAMs according to one example embodiment of the present invention.

Referring now to FIG. 6, there is illustrated an example embodiment of a memory circuit 600 according to the present invention. The memory circuit 600 includes one or more DRAMs 610. Each of the DRAMs 610 includes multiple data pins 640 and multiple command and address pins 630. The memory circuit 600 further includes a controller 620 coupled to the one or more DRAMs 610 via the data pins 640 and the command and address pins 630. In some embodiments, the controller is a device, such as a CPU, a GPU, a processor, and a DRAM controller. Also in these embodiments, the DRAMs can be any integrated circuit memory devices, such as flash memory device, a volatile memory device, a non-volatile memory device, a static random access memory (SRAM) device, and/or a static memory device. In some embodiments, the multiple command and address pins 630 are coupled to the controller 620 through a coupling medium 650, such as input/output interface and/or a bus.

In operation, the controller 620 sends command and address signals to each integrated circuit memory device 610 via the associated multiple command and address pins 630, respectively, during a clock cycle of a clock signal so as to increase the transfer rate of the command and address signals during the clock cycle. This is accomplished by sending a higher number of command and address signals than available number of command and address pins 630 in each integrated circuit memory device 610.

In some embodiments, the controller 620 sends the command and address signals upon both rising and falling edges of a clock cycle when transferring data to and from each integrated circuit memory device 610 to increase transfer rate of the command and address signals within the clock cycle for a given number of the command and address pins 630 in each integrated circuit memory device 610. In other embodiments, the controller 620 sends the command and address signals upon a rising edge of a clock cycle and further sends remaining address signals upon a falling edge of the clock cycle when transferring the data to and from the integrated circuit memory device 610.

In some embodiments, the controller 620 sends the command and address signals to each integrated circuit memory device 610 via its associated multiple command and address pins 630, respectively, upon two substantially consecutive rising edges of a clock signal to increase transfer rate of the command and address signals. In other embodiments, the controller 620 sends the command and address signals to each integrated circuit memory device 610 via its associated multiple command and address pins 630, respectively, upon a rising edge of a clock cycle in a clock signal. Further, the controller 620 sends the address signals upon a rising edge of a substantially subsequent clock cycle to each integrated circuit memory device 610 via its associated multiple command and address pins 630, respectively, to increase transfer rate of the command and address signals to each integrated circuit memory device 610 in the two substantially consecutive clock cycles. In the above described embodiments, each of the integrated circuit memory devices 610 perform the memory command in response to receiving the set of command and address signals. The advantages in using the above techniques to send command and address signals are described-above in more detail with reference to FIGS. 2-5.

Figure 7:
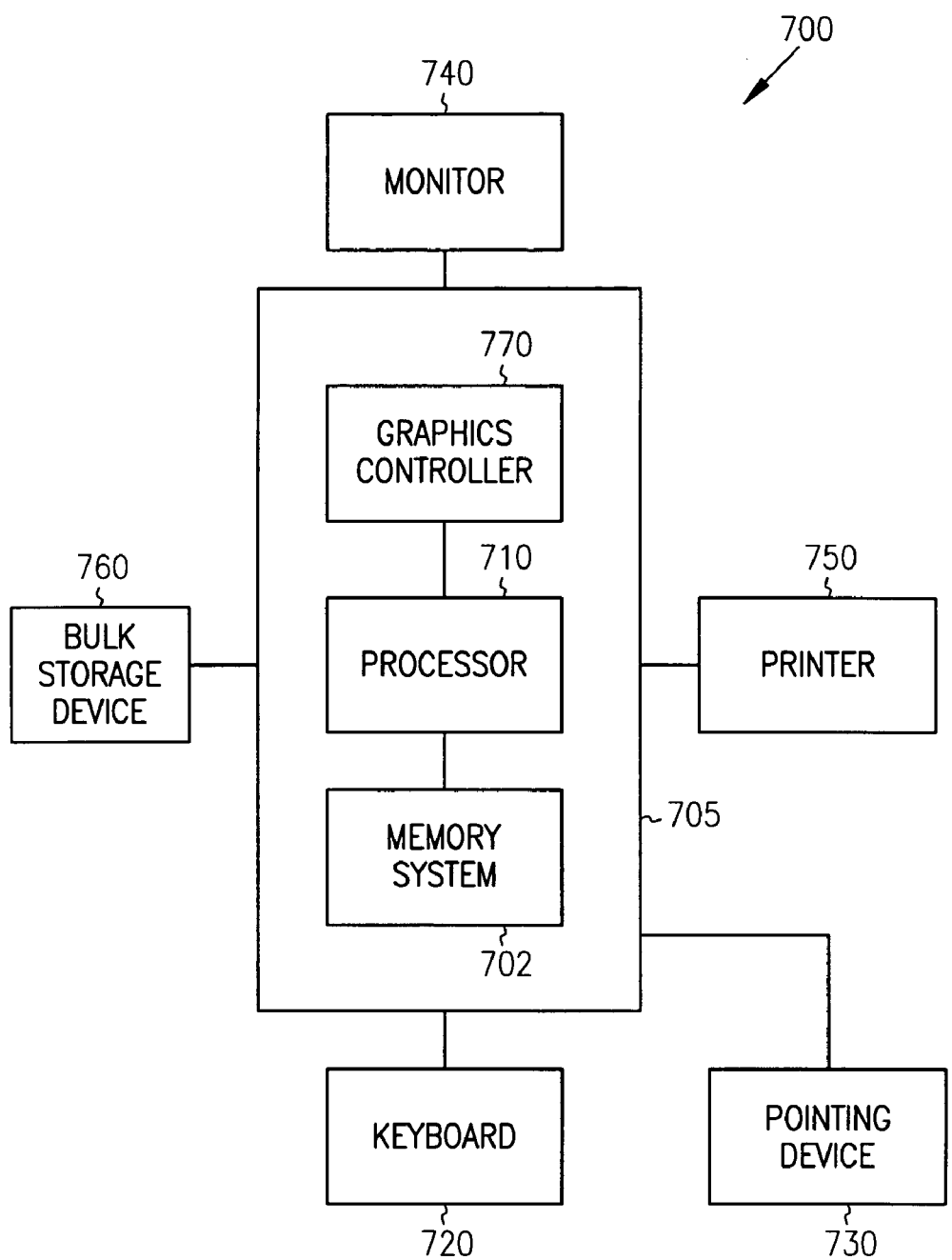
FIG. 7 is a block diagram of an exemplary computer system.

FIG. 7 is a block diagram of a system according to one embodiment of the present invention. Computer system 700 contains a processor 710 and a memory system 702 housed in a computer unit 705. Computer system 700 is but one example of an electronic system containing another electronic system, e.g., memory system 702, as a subcomponent. The memory system 702 includes a memory device that includes a multichip module as discussed in various embodiments of the present invention. Computer system 700 optionally contains user interface components. These user interface components include a keyboard 720, a pointing device 730, a monitor 740, a printer 750, and a bulk storage device 760. It will be appreciated that other components are often associated with computer system 700 such as modems, device driver cards, additional storage devices, etc. It will further be appreciated that the processor 710 and memory system 702 of computer system 700 can be incorporated on a single integrated circuit. Such single-package processing units reduce the communication time between the processor and the memory circuit. Any of these components of the system may contain a memory controller to initiate command and address signals to retrieve data from a memory device according to the present invention. This is particularly true of graphics subsystem 770 of FIG. 7 utilizing SGRAM that includes a solid film formed as discussed in various embodiments of the present invention.

Figure 8:
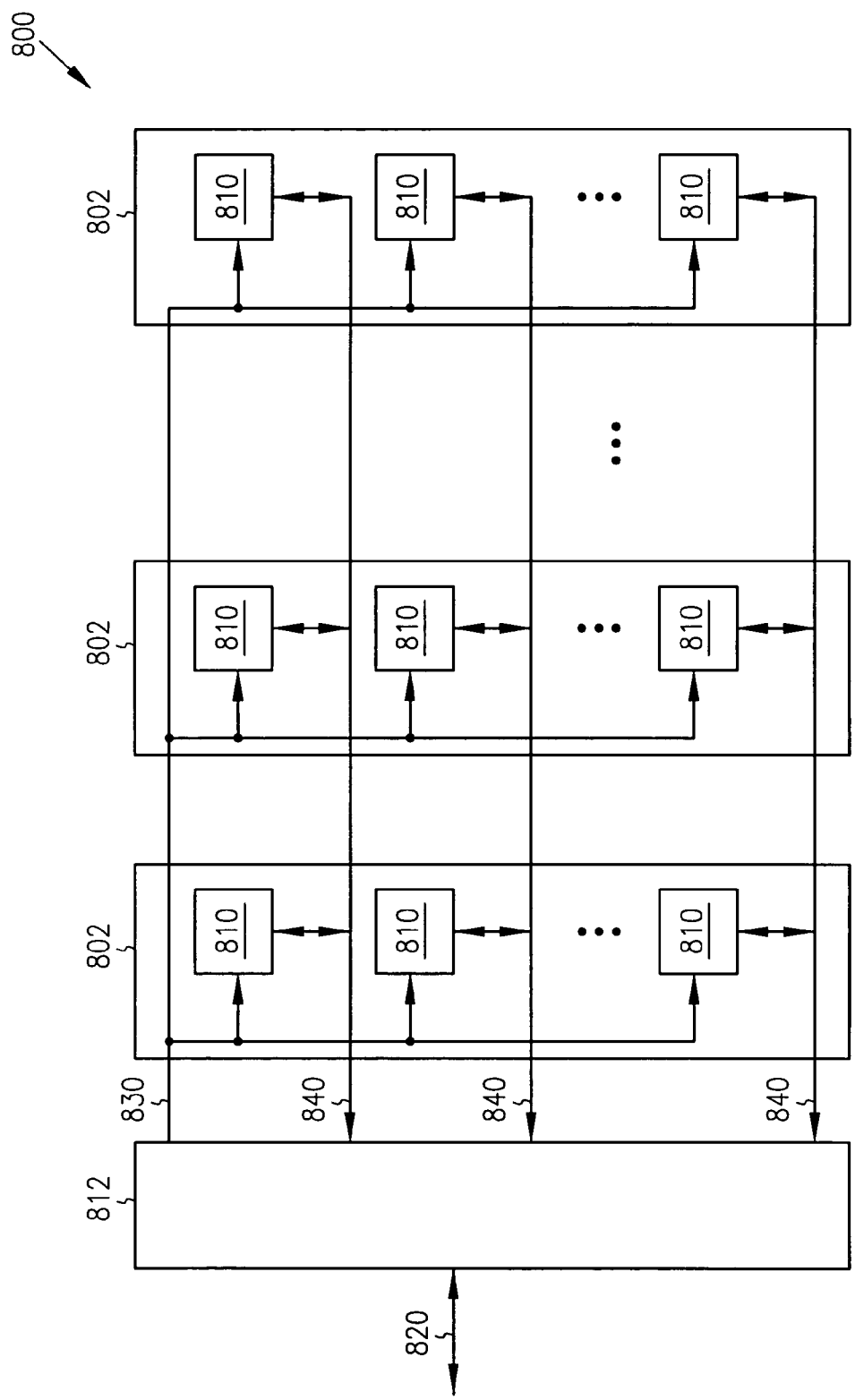
FIG. 8 is a block diagram of an exemplary memory system.

FIG. 8 is a block diagram of a system according to one embodiment of the present invention. Memory system 800 contains one or more multichip modules 802 and a memory controller 812. Each memory module 802 includes at least one memory device 810. Memory controller 812 provides and controls a bidirectional interface between memory system 800 and an external system bus 820. Memory system 800 accepts a command signal from the external bus 820 and relays it to the one or more memory modules 802 on a command link 830. Memory system 800 provides for data input and data output between the one or more memory modules 802 and external system bus 820 on data links 840. At least one of the memory devices 810 includes the DRAM controller to initiate command and address signals to retrieve data from one or more DRAMs according to the present matter.

Figure 9:
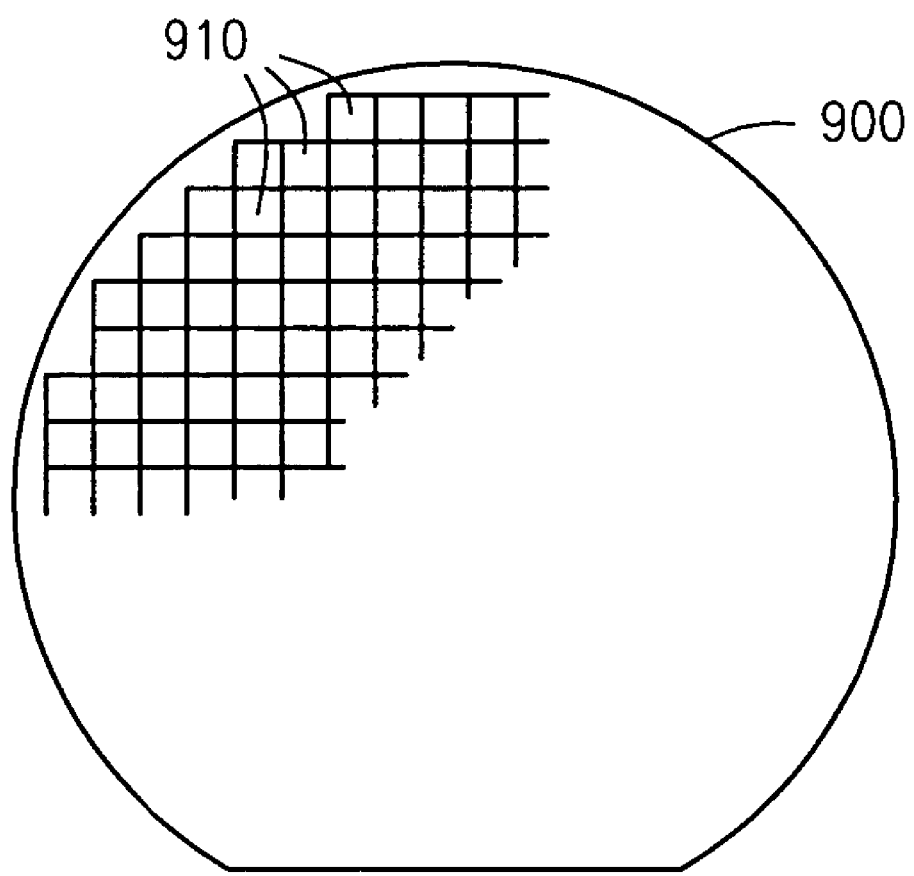
FIG. 9 is an elevational view of a substrate containing semiconductor dies.

With reference to FIG. 9, in one embodiment, a semiconductor die 910 is produced from a silicon wafer 900. A die is an individual pattern, typically rectangular, on a substrate that contains circuitry to perform a specific function. A semiconductor wafer will typically contain a repeated pattern of such dies containing the same functionality. Die 910 may contain multichip modules, as discussed above. Die 910 may further contain additional circuitry to extend to such complex devices as a monolithic processor with multiple functionality. Die 910 includes a DRAM controller coupled to one or more DRAMs as discussed in various embodiments of the present invention.

CONCLUSION

The present invention provides techniques to send command and address signals on both the rising and falling edges and/or on two consecutive rising or falling edges of a clock cycle (timing signal), thereby essentially reducing the number of command and address pins required by the DRAMs.

In one aspect, the invention provides techniques for reducing the number of command and address pins required in a DRAM. In this aspect, the invention includes sending command and address signals to one or more DRAMs to transfer data to and from the DRAMs upon both the rising and falling edges of a clock cycle.

In accordance with another aspect of the present invention, a technique for reducing the number of command and address pins required on a DRAM includes sending the command and address signals on the first edge of a clock cycle and further sending address signals on the following edge of the clock cycle.

In accordance with yet another aspect of the present invention, a technique for reducing the number of required command and address pins on a DRAM includes sending the command and address signals on two consecutive rising edges (or falling edges) of a clock signal. In accordance with yet another aspect of the present invention, a technique for reducing the number of required command and address pins on a DRAM includes sending the command and address signals on a rising edge of a clock cycle and further sending the address signals on a subsequent rising edge of the clock cycle.

Additional advantages and features of the present invention will be more apparent from the detailed description and accompanying drawings, which illustrate preferred embodiments of the invention.

The above description illustrates preferred embodiments, which achieve the features and advantages of the present invention. It is not intended that the present invention be limited to the illustrated embodiments. Modifications and substitutions to specific process conditions and structures can be made without departing from the spirit and scope of the present invention. Accordingly, the invention is not to be The invention claim is:

1. A method of operating a non-volatile memory device, comprising:
   receiving an F-bit word, wherein F is a positive integer, wherein the F-bit word comprises a set of command and address signals, wherein the set of command and address signals consists of an Active command signal, Bank Address signals BA0-BA2, and Row Address signals A0-A11, and wherein the receiving the F-bit word comprises:
      receiving a first portion of the F-bit word substantially simultaneous with receiving a first event, wherein the first portion of the F-bit word comprises G-bits, wherein G is less than F, wherein the first portion of the F-bit word comprises the Active command signal, the Bank Address signals BA0-BA2, and a first subset of Row Address signals, wherein the receiving the Active command signal includes using a set of Command Pins, and wherein the receiving the Bank Address signals and the first subset of Row Address signals includes using a set of Address Pins; and
      receiving a second portion of the F-bit word substantially simultaneous with receiving a second event, wherein the second portion of the F-bit word comprises H-bits, wherein H is F-G, wherein the second portion of the F-bit word comprises a second subset of Row Address signals, and wherein the receiving the second subset of Row Address signals includes using the set of Command Pins and the set of Address Pins;
      performing a memory command, in a non-volatile memory, in response to the received F-bit word;
   sending the first portion of the F-bit word substantially simultaneous with sending the first event by an external controller; and
   sending the second portion of the F-bit word substantially simultaneous with sending the second event by the external controller.

2. The method of claim 1, wherein a non-volatile memory device includes a flash memory device.

3. The system of claim 1, wherein the first event comprises a first edge of a clock signal and the second event comprises a second edge of the clock signal.

4. The system of claim 3, wherein the first edge of the clock signal is a rising edge, wherein a rising edge is a transition from logic level "zero" to logic level "one", and wherein the second edge of the clock signal is a falling edge, wherein a falling edge is a transition from logic level "one" to logic level "zero".

5. The system of claim 1, wherein the first event comprises a first edge of a first cycle of a clock signal and the second event comprises a first edge of a second cycle of the clock signal.

6. The system of claim 5, wherein the first edge of the clock signal is a rising edge, wherein a rising edge is a transition from logic level "zero" to logic level "one".

7. The method of claim 1, wherein the external controller comprises at least one of a group consisting essentially of a central processing unit (CPU), a graphics processing unit (GPU), and a processor.

8. A system, comprising:
   at least one non-volatile memory device, comprising:
      means for receiving an F-bit word, wherein F is a positive integer, wherein the F-bit word comprises a set of command and address signals, wherein the set of command and address signals consists of an Active command signal, Bank Address signals BA0-BA2, and Row Address signals A0-A11, and wherein the means for receiving the F-bit word comprises:
         means for receiving a first portion of the F-bit word substantially simultaneous with receiving a first event, wherein the first portion of the F-bit word comprises G-bits, wherein G is less than F, wherein the first portion of the F-bit word comprises the Active command signal, the Bank Address signals BA0-BA2, and a first subset of Row Address signals, wherein the means for receiving the Active command signal includes using a set of Command Pins, and wherein the means for receiving the Bank Address signals and the first subset of Row Address signals includes using a set of Address Pins; and
         means for receiving a second portion of the F-bit word substantially simultaneous with receiving a second event, wherein the second portion of the F-bit word comprises H-bits, wherein H is F-G, wherein the second portion of the F-bit word comprises a second subset of Row Address signals, and wherein the means for receiving the second subset of Row Address signals includes using the set of Command Pins and the set of Address Pins;
      means for performing a memory command in response to the received F-bit word;
      means for sending the first portion of the F-bit word substantially simultaneous with sending the first event by an external controller; and
      means for sending the second portion of the F-bit word substantially simultaneous with sending the second event by the external controller.

9. The system of claim 8, wherein a non-volatile memory device includes a flash memory device.

10. The system of claim 8, wherein the first event comprises a first edge of a clock signal and the second event comprises a second edge of the clock signal.

11. The system of claim 10, wherein the first edge of the clock signal is a rising edge, wherein a rising edge is a transition from logic level "zero" to logic level "one", and wherein the second edge of the clock signal is a falling edge, wherein a falling edge is a transition from logic level "one" to logic level "zero".

12. The system of claim 8, wherein the first event comprises a first edge of a first cycle of a clock signal and the second event comprises a first edge of a second cycle of the clock signal.

13. The system of claim 12, wherein the first edge of the clock signal is a rising edge, wherein a rising edge is a transition from logic level "zero" to logic level "one".

14. The system of claim 8, wherein the external controller comprises at least one of a group consisting essentially of a central processing unit (CPU), a graphics processing unit (GPU), and a processor.

15. A system, comprising:
   at least one non-volatile memory device, comprising:
      multiple command and address pins;
      wherein the multiple command and address pins are configured to receive a first portion of an F-bit word, wherein F is a positive integer, wherein the F-bit word comprises a set of command and address signals, wherein the set of command and address signals consists of an Active command signal, Bank Address signals BA0-BA2, and Row Address signals A0-A11, wherein the first portion of the F-bit word comprises the Active command signal, the Bank Address signals BA0-BA2, and a first subset of Row Address signals, wherein the multiple command and address pins receive the first portion of the F-bit word substantially simultaneous with receiving a first event, wherein the command pins are configured to receive the Active command signal, and wherein the address pins are configured to receive the Bank Address signals BA0-BA2 and the first subset of Row Address signals;

wherein the multiple command and address pins are configured to receive a second portion of an F-bit word, wherein the second portion of the F-bit word comprises a second subset of Row Address signals, and wherein the multiple command and address pins receive the second portion of the F-bit word substantially simultaneous with receiving a second event; and wherein the non-volatile memory device is configured to perform a memory command in response to the received F-bit word;

at least one external controller;

wherein the external controller is configured to send the first event, wherein the external controller is configured to send the first portion of the F-bit word substantially simultaneous with sending the first event; and wherein the external controller is configured to send the second event, wherein the external controller is configured to send the second portion of the F-bit word substantially simultaneous with sending the second event.

16. The system of claim 15, wherein a non-volatile memory device includes a flash memory device.

17. The device of claim 15, wherein the first event comprises a first edge of a clock signal and the second event comprises a second edge of the clock signal.

18. The system of claim 17, wherein the first edge of the clock signal is a rising edge, wherein a rising edge is a transition from logic level "zero" to logic level "one", and wherein the second edge of the clock signal is a falling edge, wherein a falling edge is a transition from logic level "one" to logic level "zero".

19. The device of claim 15, wherein the first event comprises a first edge of a first cycle of a clock signal and the second event comprises a first edge of a second cycle of the clock signal.

20. The system of claim 19, wherein the first edge of the clock signal is a rising edge, wherein a rising edge is a transition from logic level "zero" to logic level "one".

21. The system of claim 15, wherein the external controller comprises at least one of a group consisting essentially of a central processing unit (CPU), a graphics processing unit (GPU), and a processor.

22. A method of operating a non-volatile memory device, comprising:

receiving an F-bit word, wherein F is a positive integer, wherein the F-bit word comprises a set of command and address signals, wherein the set of command and address signals consists of an Active command signal, Bank Address signals, and Row Address signals, wherein the Active command signal comprises CS# low, RAS# low, CAS# high, and WE# high, and wherein the receiving the F-bit word comprises:

receiving a first portion of the F-bit word substantially simultaneous with receiving a first event, wherein the first portion of the F-bit word comprises G-bits, wherein G is less than F, wherein the first portion of the F-bit word comprises the Active command signal, the Bank Address signals, and a first subset of Row Address signals, wherein the receiving the Active command signal includes using a set of Command Pins, and wherein the receiving the Bank Address signals and the first subset of Row Address signals includes using a set of Address Pins; and receiving a second portion of the F-bit word substantially simultaneous with receiving a second event, wherein the second portion of the F-bit word comprises H-bits, wherein H is F-G, wherein the second portion of the F-bit word comprises a second subset of Row Address signals, and wherein the receiving the second subset of Row Address signals includes using the set of Command Pins and the set of Address Pins;

performing a memory command, in a non-volatile memory, in response to the received F-bit word;

sending the first portion of the F-bit word substantially simultaneous with sending the first event by an external controller; and sending the second portion of the F-bit word substantially simultaneous with sending the second event by the external controller.

23. The method of claim 22, wherein a non-volatile memory device includes a flash memory device.

24. The system of claim 22, wherein the first event comprises a first edge of a clock signal and the second event comprises a second edge of the clock signal.

25. The system of claim 24, wherein the first edge of the clock signal is a rising edge, wherein a rising edge is a transition from logic level "zero" to logic level "one", and wherein the second edge of the clock signal is a falling edge, wherein a falling edge is a transition from logic level "one" to logic level "zero".

26. The system of claim 22, wherein the first event comprises a first edge of a first cycle of a clock signal and the second event comprises a first edge of a second cycle of the clock signal.

27. The system of claim 24, wherein the first edge of the clock signal is a rising edge, wherein a rising edge is a transition from logic level "zero" to logic level "one".

28. The method of claim 22, wherein the external controller comprises at least one of a group consisting essentially of a central processing unit (CPU), a graphics processing unit (GPU), and a processor.

29. A system, comprising:

at least one non-volatile memory device, comprising:

means for receiving an F-bit word, wherein F is a positive integer, wherein the F-bit word comprises a set of command and address signals, wherein the set of command and address signals consists essentially of an Active command signal, Bank Address signals, and Row Address signals, wherein the Active command signal comprises CS# low, RAS# low, CAS# high, and WE# high, and wherein the means for receiving the F-bit word comprises:

means for receiving a first portion of the F-bit word substantially simultaneous with receiving a first event, wherein the first portion of the F-bit word comprises G-bits, wherein G is less than F, wherein the first portion of the F-bit word comprises the Active command signal, the Bank Address signals, and a first subset of Row Address signals, wherein the means for receiving the Active command signal includes using a set of Command Pins, and wherein the means for receiving the Bank Address signals and the first subset of Row Address signals includes using a set of Address Pins; and means for receiving a second portion of the F-bit word substantially simultaneous with receiving a second event, wherein the second portion of the F-bit word comprises H-bits, wherein H is F-G, wherein the second portion of the F-bit word comprises a second subset of Row Address signals, and wherein the means for receiving the second subset of Row Address signals includes using the set of Command Pins and the set of Address Pins;

means for performing a memory command in response to the received F-bit word;

means for sending the first portion of the F-bit word substantially simultaneous with sending the first event by an external controller; and means for sending the second portion of the F-bit word substantially simultaneous with sending the second event by the external controller.

30. The system of claim 29, wherein a non-volatile memory device includes a flash memory device.

31. The system of claim 29, wherein the first event comprises a first edge of a clock signal and the second event comprises a second edge of the clock signal.

32. The system of claim 31, wherein the first edge of the clock signal is a rising edge, wherein a rising edge is a transition from logic level "zero" to logic level "one", and wherein the second edge of the clock signal is a falling edge, wherein a falling edge is a transition from logic level "one" to logic level "zero".

33. The system of claim 29, wherein the first event comprises a first edge of a first cycle of a clock signal and the second event comprises a first edge of a second cycle of the clock signal.

34. The system of claim 33, wherein the first edge of the clock signal is a rising edge, wherein a rising edge is a transition from logic level "zero" to logic level "one".

35. The system of claim 29, wherein the external controller comprises at least one of a group consisting essentially of a central processing unit (CPU), a graphics processing unit (GPU), and a processor.

36. A system, comprising:
   at least one non-volatile memory device, comprising:
      multiple command and address pins;
      wherein the multiple command and address pins are configured to receive a first portion of an F-bit word, wherein F is a positive integer, wherein the F-bit word comprises a set of command and address signals, wherein the set of command and address signals consists of an Active command signal, Bank Address signals, and Row Address signals, wherein the Active command signal comprises CS# low, RAS# low, CAS# high, and WE# high, wherein the first portion of the F-bit word comprises the Active command signal, the Bank Address signals, and a first subset of Row Address signals, wherein the multiple command and address pins receive the first portion of the F-bit word substantially simultaneous with receiving a first event, wherein the command pins are configured to receive the Active command signal, and wherein the address pins are configured to receive the Bank Address signals and the first subset of Row Address signals;
      wherein the multiple command and address pins are configured to receive a second portion of an F-bit word, wherein the second portion of the F-bit word comprises a second subset of Row Address signals, and wherein the multiple command and address pins receive the second portion of the F-bit word substantially simultaneous with receiving a second event; and
      wherein the non-volatile memory device is configured to perform a memory command in response to the received F-bit word;
   at least one external controller;
   wherein the external controller is configured to send the first event, wherein the external controller is configured to send the first portion of the F-bit word substantially simultaneous with sending the first event; and
   wherein the external controller is configured to send the second event, wherein the external controller is configured to send the second portion of the F-bit word substantially simultaneous with sending the second event.

37. The system of claim 36, wherein a non-volatile memory device includes a flash memory device.

38. The device of claim 36, wherein the first event comprises a first edge of a clock signal and the second event comprises a second edge of the clock signal.

39. The system of claim 38, wherein the first edge of the clock signal is a rising edge, wherein a rising edge is a transition from logic level "zero" to logic level "one", and wherein the second edge of the clock signal is a falling edge, wherein a falling edge is a transition from logic level "one" to logic level "zero".

40. The device of claim 36, wherein the first event comprises a first edge of a first cycle of a clock signal and the second event comprises a first edge of a second cycle of the clock signal.

41. The system of claim 40, wherein the first edge of the clock signal is a rising edge, wherein a rising edge is a transition from logic level "zero" to logic level "one".

42. The system of claim 36, wherein the external controller comprises at least one of a group consisting essentially of a central processing unit (CPU), a graphics processing unit (GPU), and a processor.

* * * * *

UNITED STATES PATENT AND TRADEMARK OFFICE
CERTIFICATE OF CORRECTION

| | |
|---|---|
| PATENT NO. | : 7,549,033 B2 |
| APPLICATION NO. | : 11/495418 |
| DATED | : June 16, 2009 |
| INVENTOR(S) | : Joo S. Choi et al. |

Page 1 of 1

It is certified that error appears in the above-identified patent and that said Letters Patent is hereby corrected as shown below:

In column 10, line 35, in Claim 27, delete "24," and insert -- 26, --, therefor.

Signed and Sealed this

Fourth Day of August, 2009

JOHN DOLL
*Acting Director of the United States Patent and Trademark Office*